United States Patent [19]

Lee

[11] Patent Number: 5,723,359
[45] Date of Patent: Mar. 3, 1998

[54] METHOD FOR CONCURRENTLY FORMING THIN FILM RESISTOR AND THICK FILM RESISTOR ON A HYBRID INTEGRATED CIRCUIT SUBSTRATE

[75] Inventor: Kyung-Hwan Lee, Kumi-shi, Rep. of Korea

[73] Assignee: LG Information & Communications, Ltd., Seoul, Rep. of Korea

[21] Appl. No.: 764,697

[22] Filed: Dec. 11, 1996

[30] Foreign Application Priority Data

Dec. 14, 1995 [KR] Rep. of Korea ............ 1995-50134

[51] Int. Cl.$^6$ .................... H01L 21/70; H01L 27/00
[52] U.S. Cl. ................. 437/60; 437/192; 437/918; 148/DIG. 136
[58] Field of Search .............. 437/60, 918, 192; 148/DIG. 136

[56] References Cited

U.S. PATENT DOCUMENTS

| | | | |
|---|---|---|---|
| 5,055,164 | 10/1991 | Hawkins et al. | 204/15 |
| 5,420,063 | 5/1995 | Naghsoudnia et al. | 437/60 |
| 5,468,672 | 11/1995 | Rosvold | 437/60 |

Primary Examiner—Jey Tsai
Attorney, Agent, or Firm—Jacobson, Price, Holman & Stern, PLLC

[57] ABSTRACT

A method forms a thin film resistor with a thick film resistor on one hybrid IC substrate, and provides a high efficiency hybrid IC utilizing advantages of both resistors. The method includes the steps of: screen-printing a thick film resistor paste on an alumina substrate, drying and performing a plastic process, and thus forming a thick film resistor; forming a thick film protecting layer on the thick film resistor; sequentially forming a tantalum (Ta) layer for a thin film resistor, a titanium (Ti) layer, a palladium (Pd) layer and a copper (Cu) layer for a conduction line on the substrate; depositing a negative photoresist layer on the Cu layer, light-exposing necessary portions of the negative photoresist layer to ultraviolet rays; sequentially electroplating a copper (Cu) layer, a nickel (Ni) layer and a gold (Au) layer on the copper (Cu) layer portions which are exposed due to an elimination of the negative photoresist layer, making a conduction line, and removing a remaining light-exposure portion of the negative photoresist layer; etching titanium (Ti) layer, palladium (Pd) layer and copper (Cu) layer of a remaining portion including the conduction line, and depositing a positive photoresist layer thereon; light-exposing necessary portions in the positive photoresist to ultraviolet rays, etching tantalum (Ta) layer portions exposed in the vicinity of removed portions, and forming a thin film resistor.

1 Claim, 4 Drawing Sheets

<STEP S6: EXPOSURE AND DEVELOPMENT OF THE APPLIED NEGATIVE PHOTO RESIST>

<STEP S7: FORMING Cu/Ti/Au LAYERS>

<STEP S8: DELETING THE EXPOSED PARTS OF THE APPLIED NEGATIVE PHOTO RESIST>

<STEP S9: ETCHING THE Ti/Pd/Cu LAYERS>

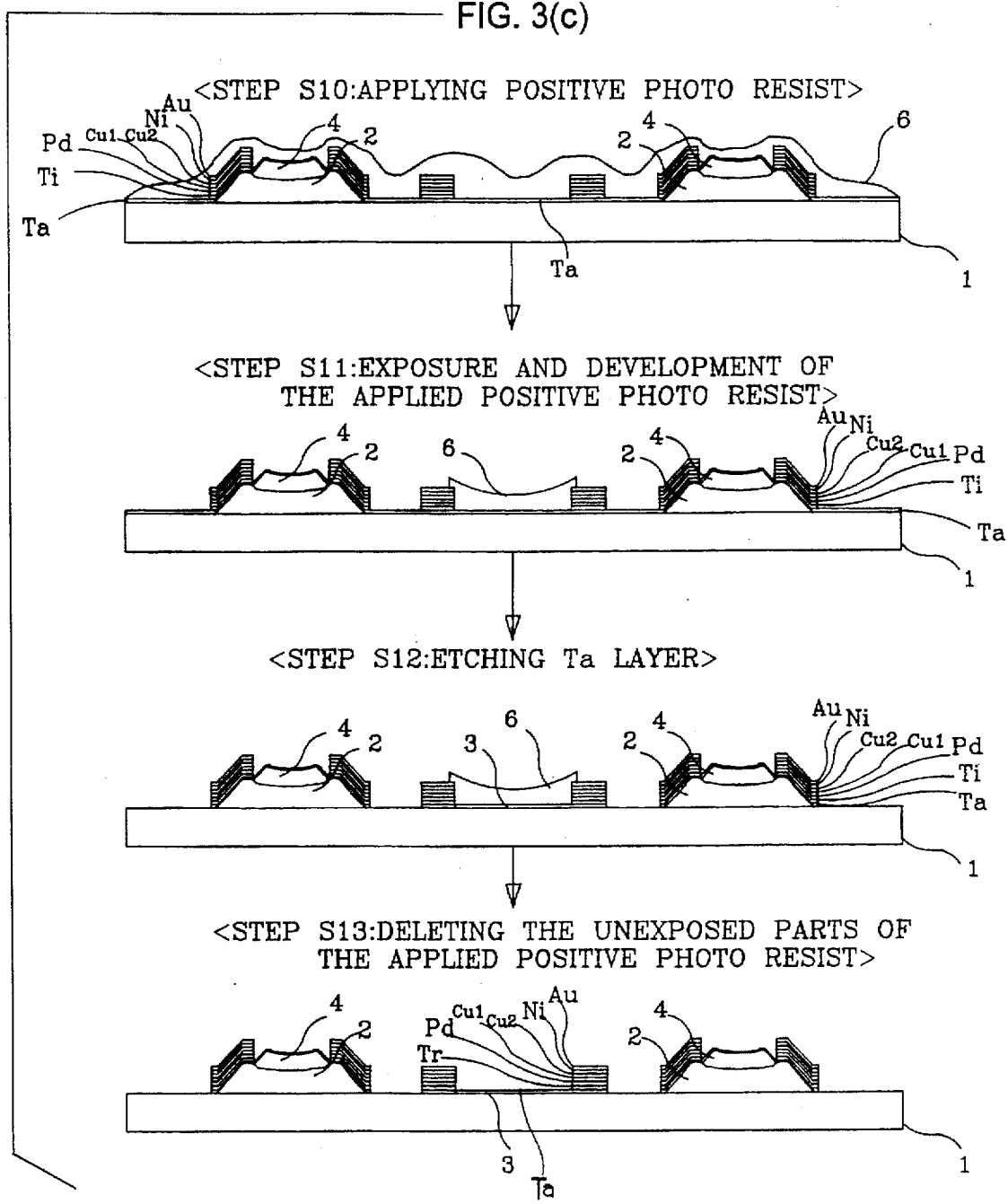

METHOD FOR CONCURRENTLY FORMING THIN FILM RESISTOR AND THICK FILM RESISTOR ON A HYBRID INTEGRATED CIRCUIT SUBSTRATE

BACKGROUND OF THE INVENTION

(1) Field of the Invention

The present invention relates to a method for forming a resistor on an integrated circuit (hereinafter referred to as an IC) substrate. More particularly, it relates to a method for concurrently forming a thin film resistor and a thick film resistor on hybrid IC substrate which forms a thin film resistor and a thick film resistor on an one hybrid IC circuit, thereby utilizing advantages of both resistors.

(2) Description of the Prior Art

A hybrid IC relating to the present invention forms conduction lines and resistors on an alumina substrate according to a needed pattern thereon, thereby achieving a desired circuit.

A conventional method for forming resistors on the hybrid IC substrate forms only one kind of thick film resistor 2 on an alumina substrate 1 as shown in FIG. 1A, or forms only one kind of thin film resistor 3 on one alumina substrate 1 as shown in FIG. 1B. As a result, the conventional method cannot provide a high efficiency hybrid IC which concurrently utilizes advantages of the thick film resistor and the thick film resistor on one substrate. Herein, the advantage of the thin film resistor is a high stability and a high reliability; and the advantage of the thick film resistor is a high output characteristic.

Typical techniques regarding a design and manufacture of the hybrid IC related to the present invention are described in 'Hybrid Circuit Design and Manufacture' written by Roydn D. Jones, 1982.

SUMMARY OF THE INVENTION

Accordingly, the present invention is directed to a method for concurrently forming a thin film resistor and a thick film resistor on hybrid IC substrate that substantially obviates one or more of the problems due to limitations and disadvantages of the prior art.

An objective of the present invention is to provide a method which forms a thin film resistor having a high stability and high reliability concurrently with a thick film resistor having a high output characteristic on one substrate, thereby achieving a high efficiency hybrid IC.

In order to achieve this objective, a method includes the steps of:

preparing an alumina substrate;

screen-printing a thick film resistor paste on the alumina substrate, drying and performing a plastic process, and thus forming a thick film resistor;

forming a thick film protecting layer on the thick film resistor;

sequentially forming a tantalum (Ta) layer which forms a thin film resistor, a titanium (Ti) layer, a palladium (Pd) layer and a copper (Cu) layer which form a conduction line on the substrate;

depositing a negative photoresist layer on the Cu layer, light-exposing necessary portions of the negative photoresist layer to ultraviolet rays, developing the portions, and removing another potions not light-exposed;

sequentially electroplating a copper (Cu) layer, a nickel (Ni) layer and a gold (Au) layer on the copper (Cu) layer portions which are exposed due to an elimination of the negative photoresist layer, making a conduction line, and removing a remaining light-exposure portion of the negative photoresist layer;

etching titanium (Ti) layer, palladium (Pd) layer and copper (Cu) layer of a remaining portion including the conduction line, and depositing a positive photoresist layer thereon;

light-exposing necessary portions among the positive photoresist layer to ultraviolet rays, removing the necessary portions, etching tantalum (Ta) layer portions exposed in the vicinity of removed portions, and forming a thin film resistor; and removing a positive photoresist layer's remaining portions which are not light-exposed.

BRIEF DESCRIPTION OF THE DRAWINGS

The preferred embodiment of the present invention will be described more specifically with reference to the attached drawings, wherein.

DETAILED DESCRIPTION OF THE PREFERRED EMBODIMENT

Reference will now be made in detail to the preferred embodiment of the present invention, examples of which are illustrated in the accompanying drawings.

Figure 1A:
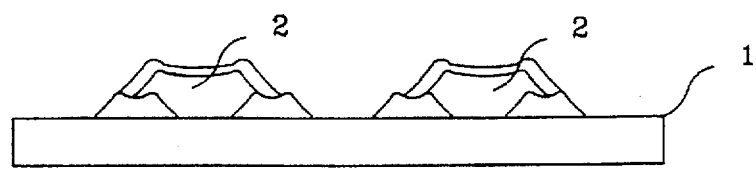
FIG. 1A shows a cross-sectional view of a conventional substrate having a thick film resistor.
Figure 1B:
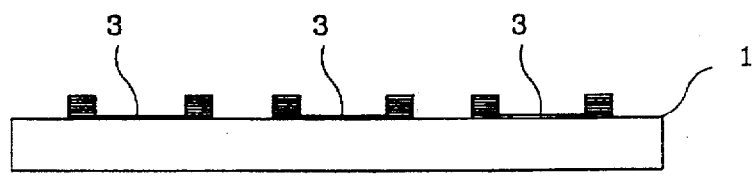
FIG. 1B shows a cross-sectional view of a conventional substrate having a thin film resistor.
Figure 2:
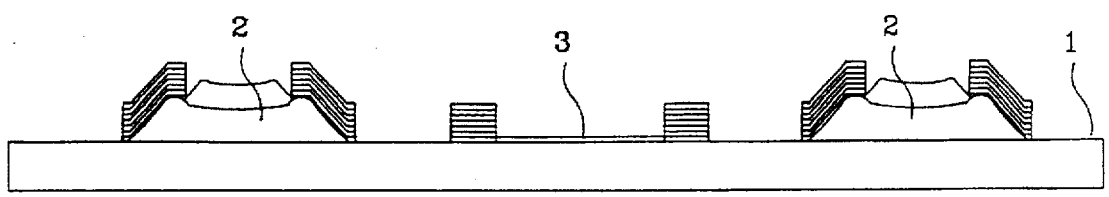
FIG. 2 shows a cross-sectional view of a substrate which concurrently has a thin film resistor and a thick film resistor in accordance with the present invention.
Figure 3A:
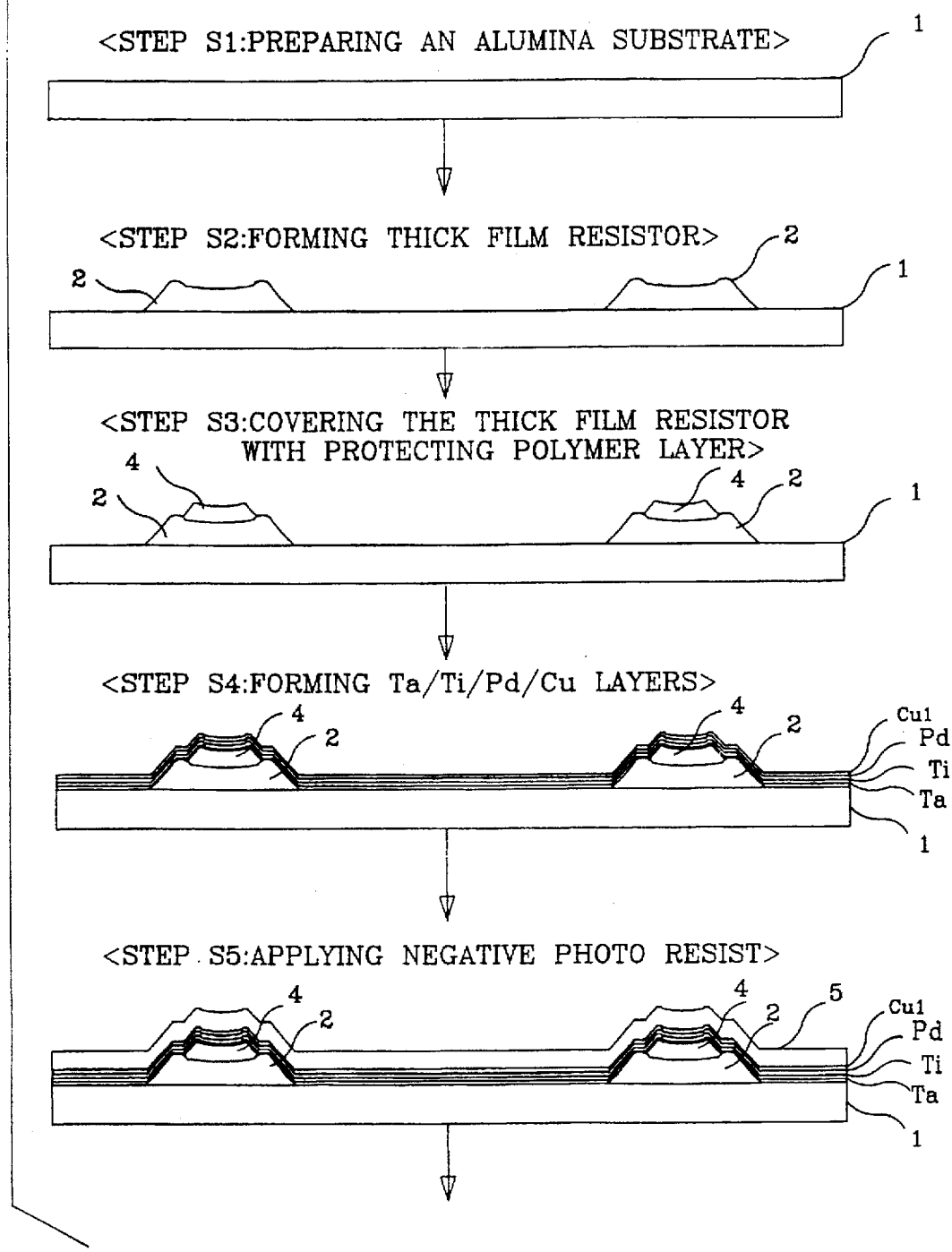
FIG. 3 sequentially shows procedures in which a thin film resistor and a thick film resistor are concurrently formed on one substrate in accordance with the present invention.
Figure 3B:
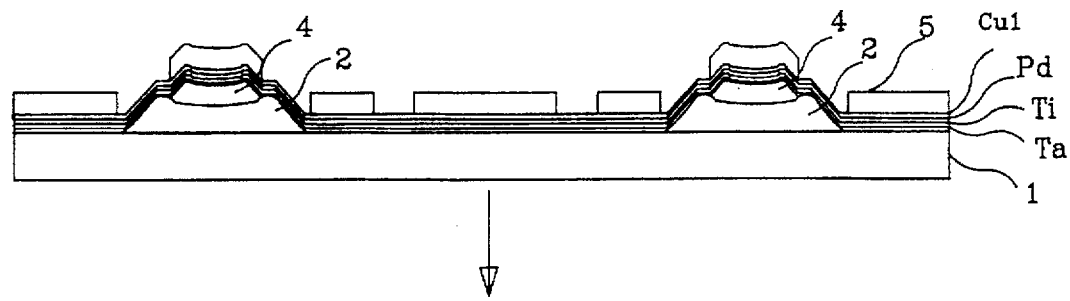
Figure 3B:
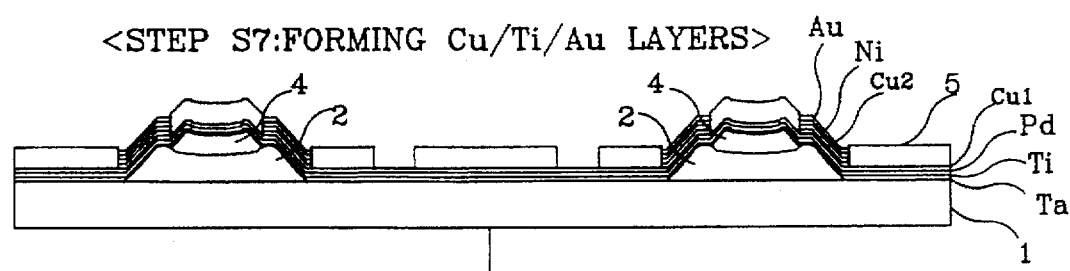
Figure 3B:
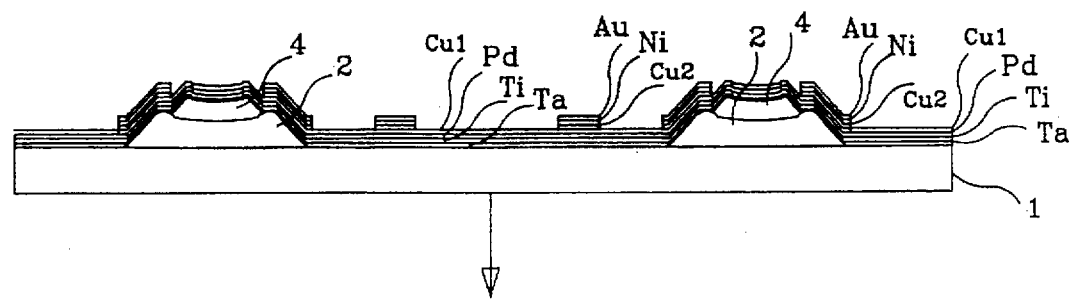
Figure 3B:
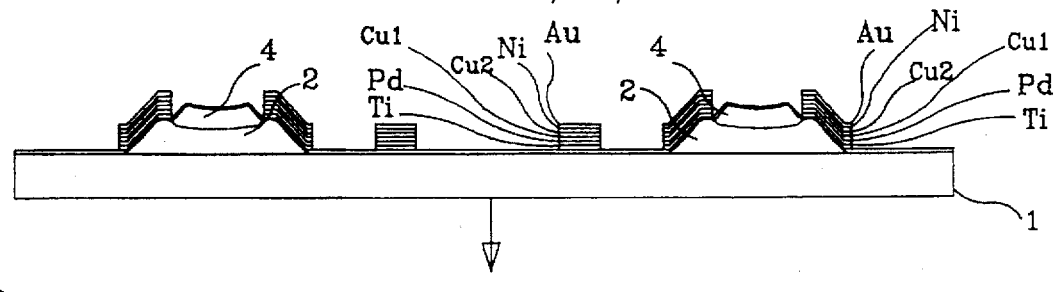

FIG. 2 schematically shows a cross-sectional view of one hybrid IC substrate wherein resistors and conduction lines are formed according to a method of the present invention. As shown in FIG. 2, the method of the present invention forms a thick film resistor 2 concurrently with a thin film resistor 3 on one hybrid IC substrate 1.

FIG. 3 sequentially shows procedures in which a thick film resistor 2 and a thin film resistor 3 are concurrently formed on one substrate 1 in the same manner as FIG. 2. FIG. 3 employs cross-sectional views of substrate 1 and structures thereon, after performing each procedure.

The method according to the present invention will now be described more specifically with reference to FIG. 3.

Firstly, the method prepares an alumina substrate 1 for making a hybrid IC (Step S1).

The method screen-prints a thick film resistor paste whose main component is $RuO_2$, as a pattern designed by using a emulsion mesh, dries the thick film resistor paste, performs a plastic process, and thus forms a thick film resistor 2 (Step S2).

After that, the method deposits a resistor protecting layer paste as of a polymer on the thick film resistor 2 in the same manner as the Step S2, dries the resistor protecting layer paste, performs a plastic process, and thus forms a thick film resistor protecting layer 4 (Step S3). In the step S3, the reason why the protecting layer 4 is formed on the thick film resistor 2 is that the thick film resistor 2 causes a chemical reaction which may change its resistor characteristic when the thick film resistor 2 is exposed to the atmosphere for a long time, even if it has a high output characteristic.

The method sequentially forms a tantalum (Ta) layer which forms a thin film resistor, a titanium (Ti) layer, a palladium (Pd) layer and a copper (Cu) layer which form a conduction line on the substrate 1, by using a sputtering method (Step S4).

The method deposits a negative photoresist layer 5 on a final copper layer Cu1 formed in the step S4 (Step S5).

The method put a light-exposure mask on the negative photoresist layer 5, light-exposes a remaining portion excepting portions corresponding to conduction line forming portions in the negative photoresist layer 5, to ultraviolet rays, develops the remaining portion, and removes another portions not light-exposed in the negative photoresist (Step S6).

The method sequentially electroplates a copper layer Cu2, a nickel (Ni) layer and a gold (Au) layer on the Cu1 layer portions which are exposed due to an elimination of the negative photoresist layer 5, and thus makes a conduction line (Step S7).

The method removes a remaining light-exposure portion of the negative photoresist layer 5 (Step S8).

The method etches titanium (Ti) layer, palladium (Pd) layer and copper (Cu) layer of a remaining portion wherein the conduction line including the Cu2, Ni and Au layers is formed (Step S9).

The method deposits a positive photoresist layer 6 on layers of the substrate 1 (Step S10).

The method light-exposes a remaining portion excepting portions corresponding to portions wherein a thin film resistor made of Ta is formed, to ultraviolet rays in the positive photoresist layer 6, develops and removes the remaining portion (Step S11).

The method etches Ta layer portions exposed due to an elimination of the positive photoresist layer 6, and forms a thin film resistor 3 comprised of the remaining Ta layer (S12).

Finally, the method removes the remaining portions which are not light-exposed, the remaining portions being left on upper part of thin film resistor in the positive photoresist layer 6. As a result, the method achieves a hybrid IC substrate in which the thin film resistor 3 are formed concurrently with the thick film resistor 2.

Accordingly, according to the above-identified steps, the present invention forms a thin film resistor 3 having a high stability and high reliability concurrently with a thick film resistor 2 having a high output characteristic on one hybrid IC substrate, thereby achieving a high efficiency hybrid IC which effectively utilizes each advantages of both resistors at the same time.

It is understood that various other modifications will be apparent to and can be readily made by those skilled in the art without departing from the scope and spirit of the invention. Accordingly, it is not intended that the scope of the claims appended hereto to be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for concurrently forming a thin film resistor and a thick film resistor on one hybrid IC substrate, comprising the steps of:

preparing an alumina substrate;

screen-printing a thick film resistor paste as a designed pattern, drying the thick film resistor paste, performing a plastic process, and thus forming a thick film resistor;

depositing a resistor protecting layer paste on the thick film resistor, drying the resistor protecting layer paste, performing a plastic process, and thus forming a thick film resistor protecting layer;

sequentially forming a tantalum (Ta) layer which forms a thin film resistor, a titanium (Ti) layer, a palladium (Pd) layer and a copper (Cu) layer which form a conduction line on the substrate, by using a sputtering method;

depositing a negative photoresist layer on the copper (Cu) layer;

light-exposing a remaining portion excepting portions corresponding to conduction line forming portions in the negative photoresist layer, to ultraviolet rays, developing the remaining portion, and removing another portions not light-exposed in the negative photoresist layer;

sequentially electroplating a copper (Cu) layer, a nickel (Ni) layer and a gold (Au) layer on the copper (Cu) layer portions which are exposed due to an elimination of the negative photoresist layer, and making a conduction line;

removing a remaining light-exposure portion of the negative photoresist layer;

etching titanium (Ti) layer, palladium (Pd) layer and copper (Cu) layer of a remaining portion wherein the conduction line including the Cu2, Ni and Au layers is formed;

depositing a positive photoresist layer on layers of the substrate;

light-exposing a remaining portion excepting portions corresponding to portions wherein a thin film resistor is formed, to ultraviolet rays, in the positive photoresist layer, developing and removing the remaining portion;

etching Ta layer portions exposed due to an elimination of the positive photoresist, and forming a thin film resistor comprised of the remaining Ta layer; and removing the remaining portions which are not light-exposed in the positive photoresist layer, and achieving a substrate in which the thin film resistor are formed concurrently with the thick film resistor.

* * * * *